(12) United States Patent
He

(10) Patent No.: US 8,473,892 B1
(45) Date of Patent: Jun. 25, 2013

(54) COMPUTER AIDED DESIGN SYSTEM AND METHOD

(75) Inventor: Zheng-Yu He, Shenzhen (CN)

(73) Assignees: Hon Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/526,582

(22) Filed: Jun. 19, 2012

(30) Foreign Application Priority Data

Feb. 29, 2012 (CN) .......................... 2012 1 0048995

(51) Int. Cl.
*G06F 17/50* (2006.01)
(52) U.S. Cl.
USPC ............................. 716/139; 716/136; 716/137
(58) Field of Classification Search
None
See application file for complete search history.

(56) References Cited

U.S. PATENT DOCUMENTS

| | | | | |
|---|---|---|---|---|
| 4,970,664 A | * | 11/1990 | Kaiser et al. | 715/804 |
| 5,903,472 A | * | 5/1999 | Barrientos | 716/113 |
| 6,516,456 B1 | * | 2/2003 | Garnett et al. | 716/119 |
| 7,263,682 B2 | * | 8/2007 | Tsai et al. | 716/112 |
| 7,353,482 B2 | * | 4/2008 | Murakawa | 716/139 |
| 7,444,255 B2 | * | 10/2008 | Hsu et al. | 702/117 |
| 8,205,183 B1 | * | 6/2012 | Goh et al. | 716/126 |
| 2006/0184906 A1 | * | 8/2006 | Aizawa | 716/6 |
| 2012/0023471 A1 | * | 1/2012 | Fischer et al. | 716/115 |

* cited by examiner

*Primary Examiner* — Leigh Garbowski
(74) *Attorney, Agent, or Firm* — Altis Law Group, Inc.

(57) ABSTRACT

A computer aided design system comprises a storage module, an interface creating module, and a calculating module. The storage module stores a contact list, one or more programs, and coordinates of each net which is being composed of a plurality of cline segments. The interface module creates a parameter setting interface on the screen of the device to display a design with a plurality of to-be-calculated nets and select at least one net in response to the user's operation. The calculating module calculates the length of each branch of the selected nets.

20 Claims, 5 Drawing Sheets

COMPUTER AIDED DESIGN SYSTEM AND METHOD

BACKGROUND

1. Technical Field

The present disclosure relates to printed circuit board layout systems, particularly, to checking dimensions of copper traces designed on the board.

2. Description of Related Art

In designing layouts for a printed circuit board (PCB), a collection of lines connected at least two electronic parts together is called a net. The net is composed of at least one copper trace, called a cline segment, connected between the electronic parts. The nets are classified as a point-to-point type and a non-point-to-point type based on the amount of the connected terminals. The net connected with two terminals is a point-to-point type, and the net connected with at least three terminals is a non-point-to-point type. A point of the non-point-to-point type net disposed on at least three cline segments is called branch node. A collection of cline segments set between a terminal and a branch node adjacent to the terminal or two branch nodes which are adjacent with each other in the connection relationship are called a branch. The length of the branch must be less than a predetermined length, and the user has to manually check the length of the branch which is complex and time consuming.

Therefore, there is room for improvement in the art.

BRIEF DESCRIPTION OF THE FIGURE

Many aspects of the embodiments can be better understood with reference to the following drawings. The components in the drawings are not necessarily drawn to scale, the emphasis instead being placed upon clearly illustrating the principles of the PCB layout system and method thereof. Moreover, in the drawings, like reference numerals designate corresponding parts throughout the several views.

DETAILED DESCRIPTION

In general, the word "module," as used herein, refers to logic embodied in hardware or firmware, or to a collection of software instructions, written in a programming language, for example, Java, C, or assembly. One or more software instructions in the modules may be embedded in firmware, such as an EPROM. It will be appreciated that modules may comprised connected logic units, such as gates and flip-flops, and may comprise programmable units, such as programmable gate arrays or processors. The modules described herein may be implemented as either software and/or hardware modules and may be stored in any type of computer-readable medium or other computer storage system. Embodiments of the present disclosure will be described with reference to the drawings.

Figure 1:
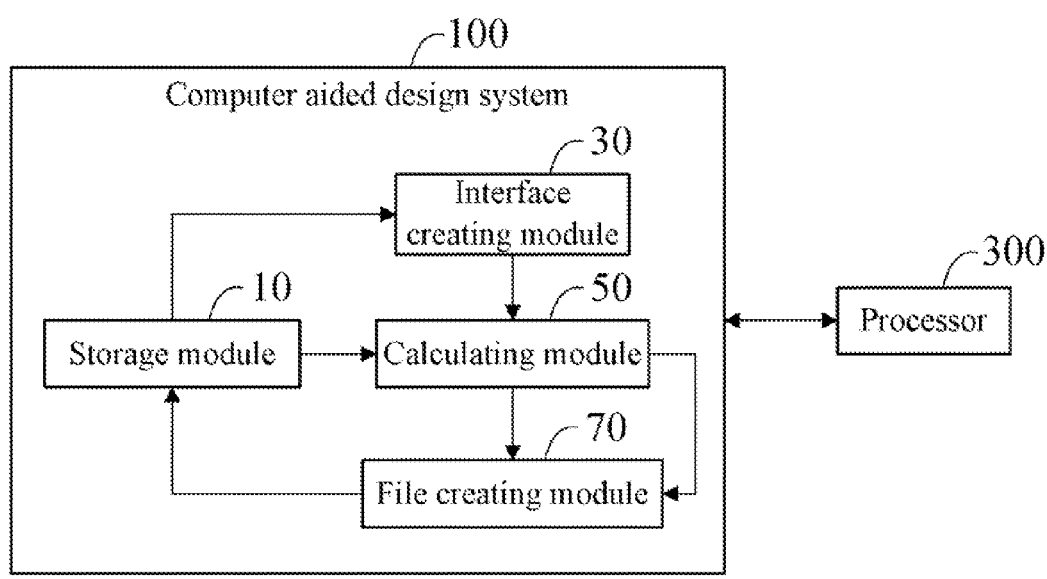
FIG. 1 is a block diagram of a device in accordance with an embodiment.
Figure 2:
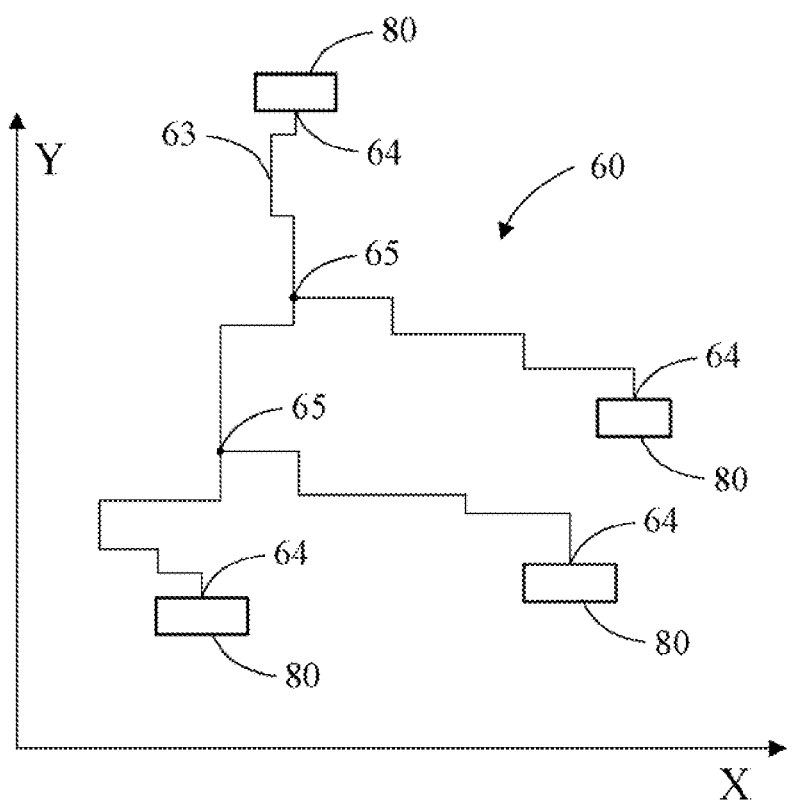
FIG. 2 is a schematic diagram of a non-point-to-point type net displayed on the screen of a computer aided design system of the device of FIG. 1.

FIG. 1 shows a device 1, such as a computer, including a computer aided design system 100 and a processor 300. The computer aided design system 100 is used for designing a printed board circuit (PCB). As shown in FIG. 2, the PCB includes and a plurality of electronic parts 80 and a plurality of nets 60 connected between the electronic parts 80. A collection of lines connected at least two electronic parts 80 together is called a net 60. The net 60 is composed of at least one copper trace, called a cline segment 63, connecting the electronic parts 80. Each cline segment 63 includes a beginning and an ending. The beginning or the ending of the cline segment 63 connected with an electronic part 80 is called a terminal 64. The beginning or the ending which is the junction of the at least three cline segments 63 is called a branch point 65. A collection of cline segments 63 between a terminal 64 and the adjacent connected branch point 65 or two adjacent connected branch point 65 is called a branch. The nets 60 are classified as a point-to-point type and a non-point-to-point type. The net 60 connected with two electronic parts 80 is a point-to-point type net 60, and the net 60 connected with at least three electronic parts 80 is a non-point-to-point type net 60. The non-point-to-point type net 60 further includes at least one branch point 65 and at least three branches. As shown in FIG. 2, the device 1 includes a grid with Cartesian rectangular coordinates or XY axes for specifically identifying locations of the electronic parts 80 and nets 60 in the design. A non-point-to-point type net 60 connected four electronic parts 80 includes a plurality of cline segments 63, four terminals 64, two branch points 65, and five branches.

The computer aided design system 100 includes a storage module 10, an interface creating module 30, a calculating module 50 and a file creating module 70. In the embodiment, the computer aided design system 100 is used in a PCB layout system to calculate the length of each branch (hereinafter referred "branch length") of the selected net 60 of PCB, and further create a file based on the calculated branch length for allowing users to check the discrepancies in comparison of what is required of a PCB design. The modules 30-50 may comprise computerized code in the form of one or more programs that are stored in the storage module 10. The computerized code includes instructions that are executed by the at least one processor 300 to provide functions for modules 10-70.

The processor 300 executes one or more computerized codes of the device 1 and other applications, to provide the functions of the device 1.

The storage module 10 may be a memory of the device 1, and also may be an external storage card, such as a smart media (SM) card, or secure digital (SD) card, for example. The storage module 10 stores the coordinates of the each net 60, the coordinates of a beginning and an ending of each cline segment 63, the coordinates of each terminal 64, and the coordinates of each branch point 65.

Figure 3:
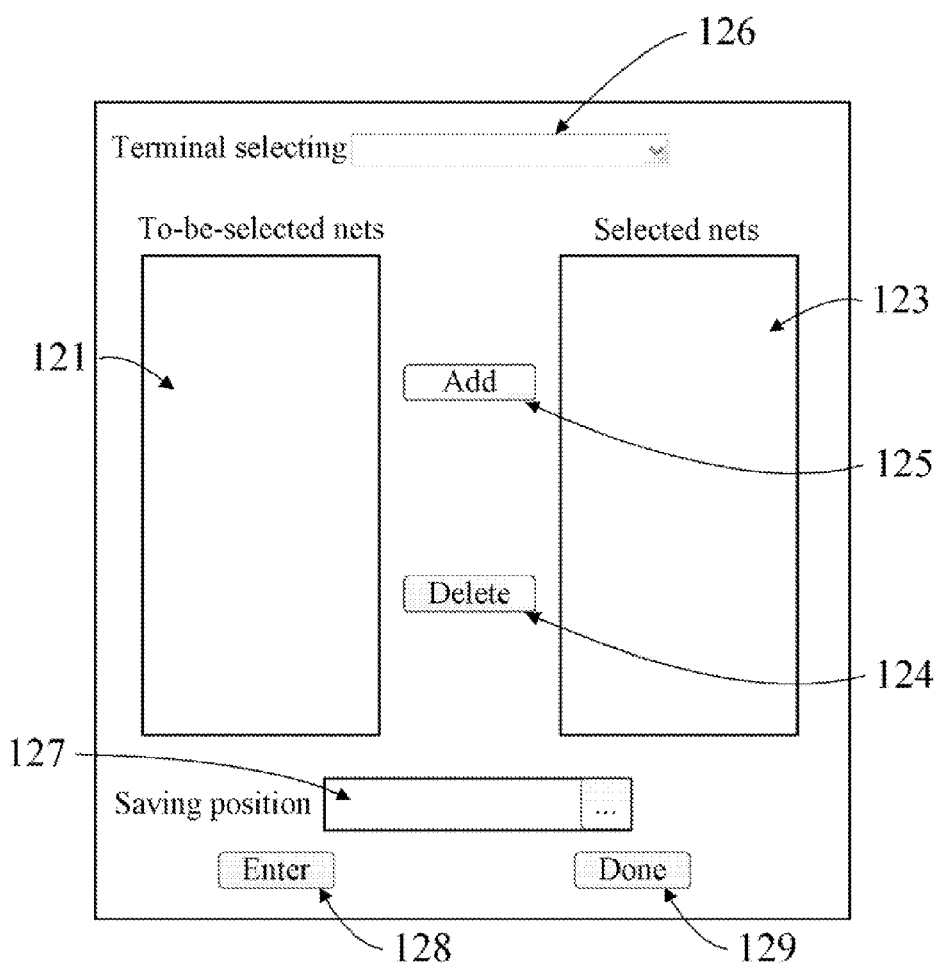
FIG. 3 is a schematic diagram showing a parameter setting window displayed on the screen of a computer aided design system of the device of FIG. 1.

As shown in FIG. 3, the interface creating module 30 provides a parameter setting interface 12 on the screen (not shown) of the device 1, by which the user can choose the to-be-checked nets 60 and the to-be-checked terminal 64. In the embodiment, the parameter setting interface 12 includes a to-be-selected net displaying box 121, a selected net displaying box 123, an add button 125, a delete button 124, a terminal selecting box 126, a position setting box 127, an enter button 128 and a done button 129. The to-be-selected net displaying box 121 is used for displaying the names of the to-be-selected nets 60 of the PCB layout design. The selected net displaying box 123 is used for displaying the names of the selected net 60 of the PCB layout design. When the add button 125 is clicked, the name of the selected net in the to-be-selected net displaying box 121 is added to and displayed in the selected net displaying box 123. When the delete button 124 is clicked, the name of the selected net in the selected net displaying box 123 is moved to the to-be-selected net displaying box 121. The terminal selecting box 126 is used for selecting a terminal 64 of the selected nets 60. The position setting box 127 is used for setting a predetermined position for saving the created file according to the user's operation. When the enter button 128 is clicked, the selected terminal in the terminal selecting box 126 and the name of the selected nets in the selected net displaying box 123 are transmitted to the calculating module 50. When the done button 129 is clicked, the parameter setting interface 12 exits.

Figure 4:
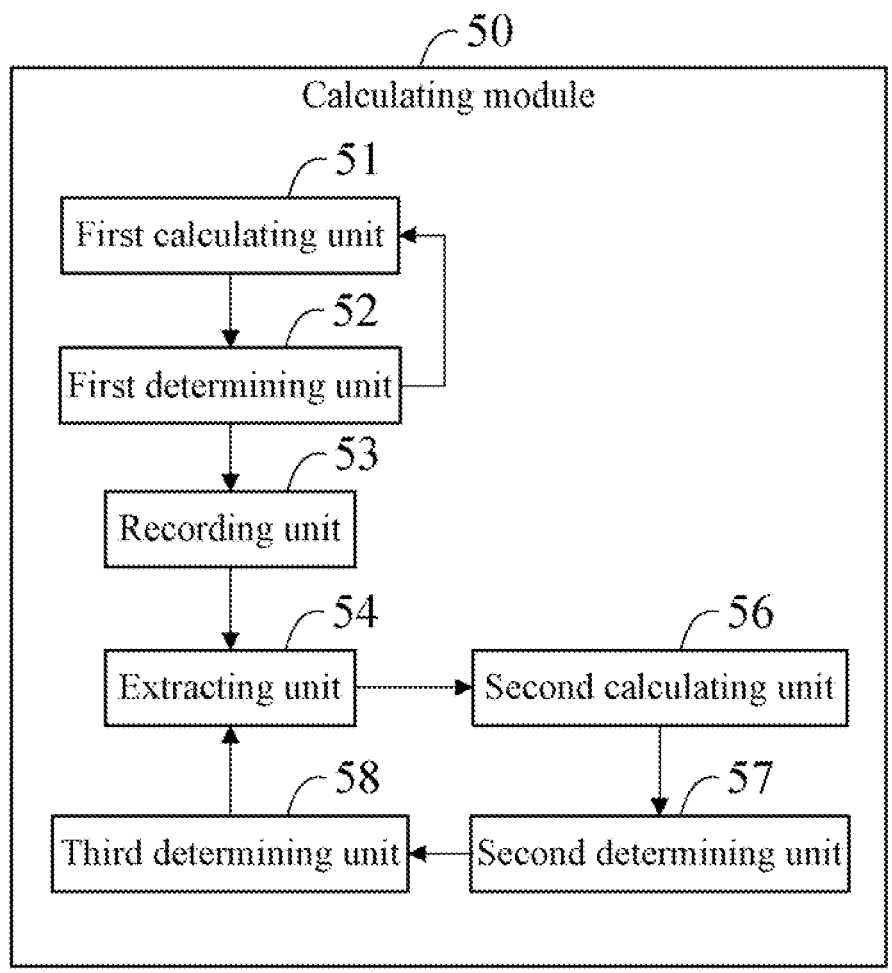
FIG. 4 is a schematic diagram of a calculating module of the computer aided design system of the device of FIG. 1.

As shown in FIG. 4, the first calculating module 50 calculates the branch length of the currently being analyzed selected net 60 based on the selected terminal 64. The calculating module 50 includes a first calculating unit 51, a first determining unit 52, a recording unit 53, an extracting unit 54, a second calculating unit 56, a second determining unit 57, and a third determining unit 58.

The first calculating unit 51 calculates the branch length including the selected terminal 64 based on the connection relationship. In detail, the first calculating unit 51 obtains the coordinates of the ending of the cline segment 63 which is applying the selected terminal 64 as the beginning, calculates the length of the cline segment 63 based on the obtained coordinates and the coordinates of the selected terminal 64. Then the first calculating unit 51 sets the obtained ending coordinates as a beginning coordinates of the next to-be-calculated cline segment 63, obtains the ending coordinates of the next to-be-calculated cline segment 63, calculates the length of the next to-be-calculated cline segment 63, then adds the calculated length. The first calculating unit 51 accomplishes the calculation of the branch length including the selected terminal 64 until the ending coordinates is a branch point 65.

The first determining unit 52 determines if the ending of the calculating cline segment 63 is a branch point 65 and generates a recording signal when the ending of the calculating cline segment 63 is a branch point 65.

The recording unit 53 records the calculated branch length and the coordinates of each ending of the cline segments 63 as an addressing coordinates which uses the calculated branch point 65 as the beginning according to the recording signal and generates an extracting signal. The recorded addressing coordinates are stored in the storage module 300 as a first-in-first-out stack manner.

The extracting unit 54 extracts an addressing coordinates according to the extracting signal.

The second calculating unit 56 calculates the length of the other branches of the currently being analyzed selected net 60 based on the extracted addressing coordinates. The second calculating unit 56 calculates the length of the cline segment 63 which respectively use the coordinates of the calculated branch point 65 and the extracted addressing coordinates as the beginning and the ending coordinates. Then the second calculating unit 56 sets the extracted addressing coordinates as the beginning coordinates of the next to-be-calculated cline segment 63, obtains the ending coordinates of the next to-be-calculated cline segment 63, calculates the length of the obtained cline segment 63, and adds the calculated length. The second calculating unit 56 accomplishes the calculation of the branch length until the ending coordinates is a branch point 65 or a terminal 64.

The second determining unit 57 determines if the calculation of a branch length is completed and generates a determining signal when the calculation of the branch length is completed. The second determining unit 57 determines if the calculating cline segment includes a branch point 65. If the calculating cline segment 63 includes a branch point 65, the calculating of the branch length is completed and the second determining unit 57 generates a recording signal. If the calculating cline segment 63 does not include a branch point 65, the second determining unit 57 further determines if the calculating cline segment 63 includes a terminal 64. If the calculating cline segment 63 includes a terminal 64, the calculating of the branch length is completed and the second determining unit 57 generates a determining signal.

The third determining unit 58 determines if addressing coordinates exist in the recording unit 53. When addressing coordinates exist in the recording unit 53, the third determining unit 58 generates an extracting signal. If no addressing coordinates exist in the recording unit 53, the third determining unit 58 generates a creating signal.

The file creating module 70 creates a branch information file saved in the set predetermined position set of the parameter setting interface 12 in response to the creating signal. In the embodiment, the branch information file includes the length of each branch and the information. The corresponding information includes the coordinates of the terminal 64 and the connected adjacent branch point 65 or two connected adjacent branch points 65.

Figure 5:
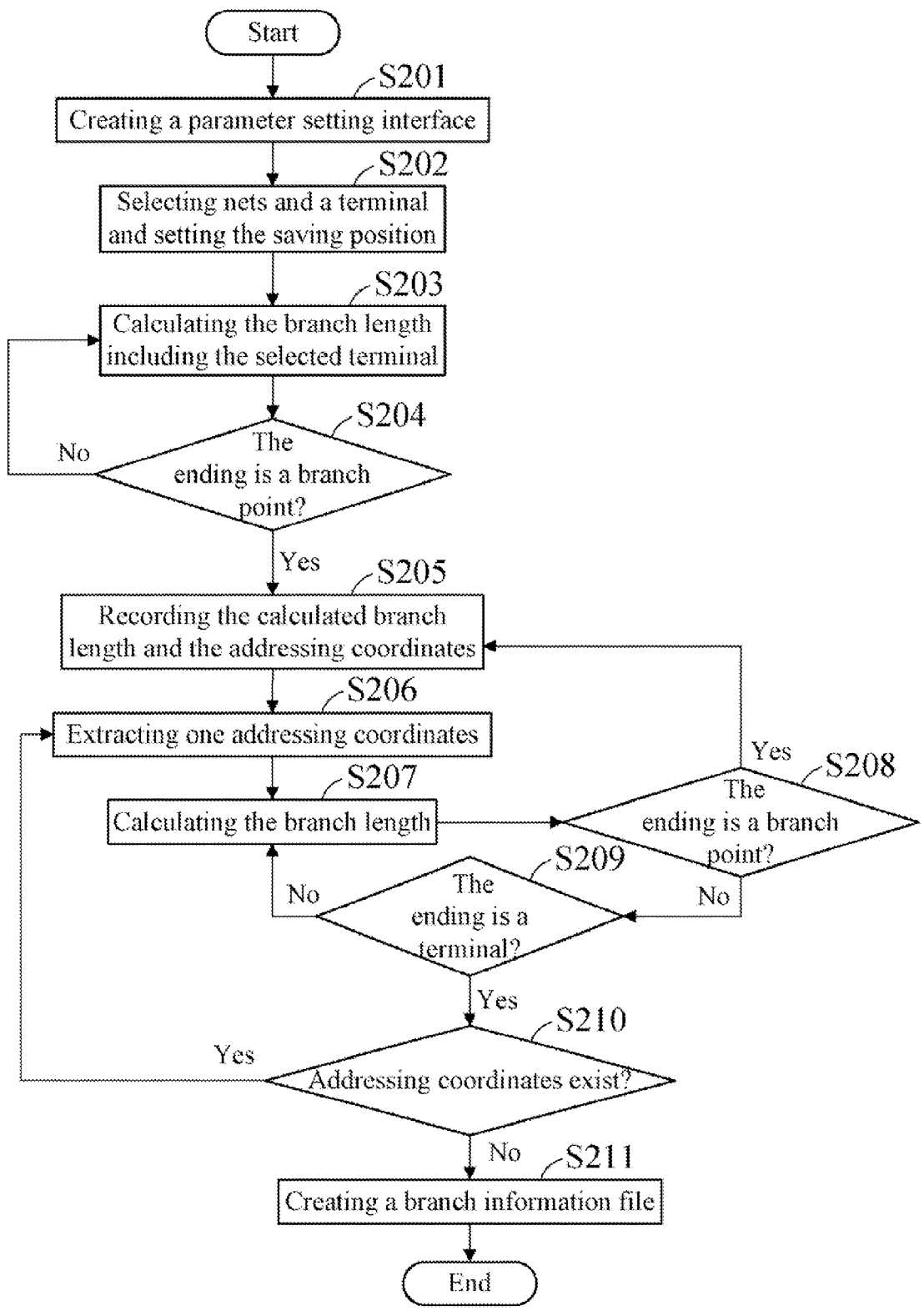
FIG. 5 is a flowchart of a checking method in accordance with the embodiment.

Referring to FIG. 5, a method is used for calculating the branch length of the selected net 60. A collection of cline segments 63 between a terminal 64 and the adjacent connected branch point 65 or two adjacent connected branch point 65 is called a branch. The calculating method includes the following steps.

In step S201, the interface creating module 30 creates a parameter setting interface for setting the parameters. In the embodiment, the parameter setting interface 12 includes a to-be-selected net displaying box 121, a selected net displaying box 123, an add button 125, a delete button 124, a terminal selecting box 126, a position setting box 127, an enter button 128 and a done button 129. The to-be-selected net displaying box 121 is used for displaying the names of the to-be-selected nets 60 of the PCB layout design. The selected net displaying box 123 is used for displaying the names of the selected net 60 of the PCB layout design. The terminal selecting box 126 is used for selecting a terminal 64 of the selected nets 60. The position setting box 127 is used for setting the saved position of the created file according to the user's operation.

In step S202, the interface creating module 30 selects the nets 40 in the parameter setting interface 12 in response to operations of the user and generates a first obtaining signal. In the embodiment, when the add button 125 is clicked, the name of the selected net in the to-be-selected net displaying box 121 is added to and displayed in the selected net displaying box 123. When the delete button 124 is clicked, the name of the selected net in the selected net displaying box 123 is moved to the to-be-selected net displaying box 121. When the enter button 128 is clicked, the selected terminal in the terminal selecting box 126 and the name of the selected nets in the selected net displaying box 123 are transmitted to the calculating module 50. When the done button 129 is clicked, the parameter setting interface 12 exits.

In step S203, the first calculating unit 51 calculates the branch length including the selected terminal 64 based on the connection relationship. In detail, the first calculating unit 51 obtains the coordinates of the ending of the cline segment 63 which is applying the selected terminal 64 as the beginning, calculates the length of the cline segment 63 based on the obtained coordinates and the coordinates of the selected terminal 64. Then the first calculating unit 51 sets the obtained ending coordinates as a beginning coordinates of the next to-be-calculated cline segment 63, obtains the ending coordinates of the next to-be-calculated cline segment 63, calculates the length of the next to-be-calculated cline segment 63, then adds the calculated length. The first calculating unit 51 accomplishes the calculation of the branch length including the selected terminal 64 until the ending coordinates is a branch point 65.

In step S204, the first determining unit 52 determines if the ending of the calculating cline segment 63 is a branch point 65. If the ending of the calculating cline segment 63 is a branch point 65, the first determining unit 52 generates a recording signal and the procedure goes to S205. If the ending of the calculating cline segment 63 is not a branch point 65, the procedure goes to S203.

In step S205, the recording unit 53 records the calculated branch length and records the coordinates of each ending of the cline segment 63 which uses the calculated branch point 65 as the beginning as addressing coordinates according to the recording signal and generates an extracting signal. The recorded addressing coordinates are stored in the storage module 300 as a first-in-first-out stack manner.

In step S206, the extracting unit 54 extracts an addressing coordinates according to the extracting signal.

In step S207, the second calculating unit 56 calculates the length of the other branches of the currently being analyzed selected net 60 based on the extracted addressing coordinates. The second calculating unit 56 calculates the length of the cline segment 63 which respectively use the coordinates of the calculated branch point 65 and the extracted addressing coordinates as the beginning and the ending coordinates. Then the second calculating unit 56 sets the extracted addressing coordinates as the beginning coordinates of the next to-be-calculated cline segment 63, obtains the ending coordinates of the next to-be-calculated cline segment 63, calculates the length of the next to-be-calculated cline segment 63, and adds the calculated length. The second calculating unit 56 accomplishes the calculation of the branch length until the ending coordinates is the coordinates of the adjacent connected branch point 65 or the terminal 64.

In step S208, the second determining unit 57 determines if the calculating cline segment includes a branch point 65. If the calculating cline segment 63 includes a branch point 65, the procedure goes to S205 and the calculating of the branch length is completed. If the calculating cline segment 63 does not include a branch point 65, the procedure goes to S209.

In step S209, the second determining unit 57 determines if the calculating cline segment 63 includes a terminal 64. If the calculating cline segment 63 does not include a terminal 64, the procedure goes to S207. If the calculating cline segment 63 includes a terminal 64, the calculating of the branch is completed and the procedure goes to S210.

In step 5210, the third determining unit 58 determines if addressing coordinates exist in the recording unit 53. If addressing coordinates exit in the recording unit 53, the procedure goes to 5206. If no addressing coordinates exist in the recording unit 53, the third determining unit 58 generates a creating signal and the procedure goes to 5211.

In step 5211, the file creating module 70 creates a branch information file saved in the set predetermined position set of the parameter setting interface 12 in response to the creating signal. In the embodiment, the branch information file includes the length of each branch and the corresponding information. The corresponding information includes the coordinates of the terminal 64 and the connected adjacent branch point 65 or two connected adjacent branch points 65.

In use, each branch length of the selected net 60 are automatically calculated by the computer and saved as branch information file in the set predetermined position, such that the calculation operation becomes simpler and saves time.

While various exemplary and preferred embodiments have been described, it is to be understood that the disclosure is not limited thereto. On the contrary, various modifications and similar arrangements (as would be apparent to those skilled in the art) are also intended to be covered. Therefore, the scope of the appended claims should be accorded the broadest interpretation so as to encompass all such modifications and similar arrangements.

What is claimed is:

1. A computer aided design system of a device used in a printed circuit board layout system, the device comprises at least one hardware processor; the computer aided design system comprises a plurality of electronic parts, nets, and one or more programs, the one or more programs comprising:
    a storage module configured to store the one or more programs executed by the at least one processor and coordinates of each nets which is being composed of a plurality of cline segments;
    an interface creating module configured to create a parameter setting interface on a screen of the device to display a design with a plurality of to-be-calculated nets, and select at least one net of the design in response to a user's operation; and
    a calculating module configured to calculate the length of each branch of the selected net which based on the connection relationship of the cline segments.

2. The computer aided design system of claim 1, wherein the parameter setting module further selects a terminal disposed on the selected net; the calculating module comprises a first calculating unit and a second calculating unit; the first calculating unit calculates the branch including the selected terminal based on the connection relationship, the second calculating unit calculates the length of the other branches of the selected net.

3. The computer aided design system of claim 2, wherein the calculating module further comprises a first determining unit and a recording unit; the first determining unit determines whether the ending of the calculating cline segment is a branch point and generates a recording signal when the ending of the calculating cline segment is a branch point; the recording unit records the calculated branch length and records the coordinates of each ending of the cline segments as an addressing coordinates which use the calculated branch point as the beginning 4. The computer aided design system of claim 3, wherein the addressing coordinates are stored in the storage module as a first-in-first-out stack manner.

5. The computer aided design system of claim 3, wherein the calculating module further comprises an extracting unit and a second determining unit; the extracting unit extracts an addressing coordinates from the recording unit, the second calculating unit calculates a branch length based on the extracted addressing coordinates; the second determining unit determines whether the calculating cline segment contains a branch point and generates a recording signal when the calculating cline segment contains a branch point.

6. The computer aided design system of claim 5, wherein when the calculating cline segment does not contain a branch point, the second determining unit further determines whether the calculating cline segment contains a terminal and generates an extracting signal when the calculating cline segment contains a terminal.

7. The computer aided design system of claim 6, wherein the calculating module further comprises a third determining unit; the third determining unit determines whether addressing coordinates exist in the recording unit and generates an extracting signal when addressing coordinates exist in the recording unit.

8. The computer aided design system of claim 1, wherein the computer aided system further comprises a file creating module; the file creating module creates a branch information file saved in a predetermined position of the storage module.

9. The computer aided design system of claim 8, wherein the parameter setting module further sets the predetermined position in response to the user's operation.

10. The computer aided design system of claim 1, wherein the branch information file includes the calculated branch length and the corresponding information; the corresponding information comprises the coordinates of a terminal and an adjacent branch point connected with the terminal or two connected adjacent branch points.

11. A calculating method for the computer aided design system of a device in a printed circuit board layout, the computer aided design system capable of executed by a processor to perform instructions stored in a storage module of the device, the device comprising one or more network applications; the calculating method comprising:
creating a parameter setting interface on the screen of the device and display a design with a plurality of nets which is being composed of a plurality of cline segments;
selecting at least one net and a terminal disposed on the selected nets of the design according to a user's operation; and
calculating the length of each branch of the selected net which is a collection of cline segments set between a terminal and an adjacent branch point connected with the terminal or two branch points based on the connection relationship of the cline segments.

12. The method according to claim 11, wherein the step of calculating the length of each branch of the selected net which is a collection of cline segments set between a terminal and an adjacent branch point connected with the terminal or two branch points based on the connection relationship of the cline segments further comprising:
calculating the length of the branch including the selected terminal; and calculating the length of the other branches of the selected nets.

13. The method according to claim 12, wherein the step of calculating the branch including the selected terminal further comprising:
determining whether the ending of the calculating cline segment is a branch point; and
recording the calculated branch length and recording the coordinates of each ending of the cline segments as an addressing coordinates which use the calculated branch point as the beginning when the ending of the calculating cline segment is a branch point.

14. The method according to claim 13, wherein the addressing coordinates are stored in the storage module as a first-in-first-out stack.

15. The method according to claim 13, wherein the step of calculating the other branch of the selected nets further comprising:
extracting an addressing coordinates;
calculating the branch based on the extracted addressing coordinates; and
determining whether the calculating cline segment contains a branch point.

16. The method according to claim 15, wherein when the calculating cline segment does not contain a branch point, the step further comprising: determining whether the calculating cline segment contains a terminal.

17. The method according to claim 16, wherein when the calculating cline segment contains a terminal, the step further comprising:
determining whether there is addressing coordinates existed; and
extracting an addressing coordinates.

18. The method according to claim 17, wherein after the step of calculating the length of each branch the selected net further comprising: creating a branch information file saved in a predetermined position.

19. The method according to claim 18, wherein the parameter setting interface further sets the predetermined position according to the use's operation.

20. The method according to claim 11, wherein the branch information includes the calculated branch length and the corresponding information; the corresponding information comprises the coordinates of a terminal and an adjacent branch point connected with the terminal or two connected adjacent branch points.

* * * * *